(12) United States Patent
Brown

(10) Patent No.: US 6,501,695 B1
(45) Date of Patent: Dec. 31, 2002

(54) TECHNIQUE FOR THE REDUCTION OF MEMORY ACCESS TIME VARIATION

(75) Inventor: Jeffrey S. Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/044,339

(22) Filed: Jan. 11, 2002

(51) Int. Cl.[7] .................................................. G11C 7/00
(52) U.S. Cl. ...................................... 365/203; 365/205
(58) Field of Search ................................. 365/203, 205, 365/207, 189.07, 204

(56) References Cited

U.S. PATENT DOCUMENTS

| | | | | |
|---|---|---|---|---|
| 6,108,256 A | * | 8/2000 | Schneider | 365/203 |
| 6,125,071 A | * | 9/2000 | Kono | 365/230.03 |
| 6,191,988 B1 | * | 2/2001 | DeBrosse | 365/205 |
| 6,198,682 B1 | * | 3/2001 | Proebsting | 365/233 |
| 6,335,904 B1 | * | 1/2002 | Tsuchida | 365/233 |
| 6,373,753 B1 | * | 4/2002 | Proebsting | 365/189.09 |
| 6,392,911 B1 | * | 5/2002 | Han | 365/63 |
| 2002/0027830 A1 | * | 3/2002 | Tsuchida et al. | 365/233 |
| 2002/0036929 A1 | * | 3/2002 | Koizumi et al. | 365/189.07 |

* cited by examiner

*Primary Examiner*—Viet Q. Nguyen
*Assistant Examiner*—Hien Nguyen
(74) *Attorney, Agent, or Firm*—Christopher P. Maiorana, P.C.

(57) ABSTRACT

A memory circuit generally comprising a sense amplifier, an array of bit cells, a plurality of bit lines, and a circuit. The array of bit cells may include a far bit cell disposed in the array opposite the sense amplifier. The bit lines may couple the bit cells to the sense amplifier. The circuit may be configured to assert a far wordline signal controlling the far bit cell during a precharge cycle for the bit lines.

18 Claims, 4 Drawing Sheets

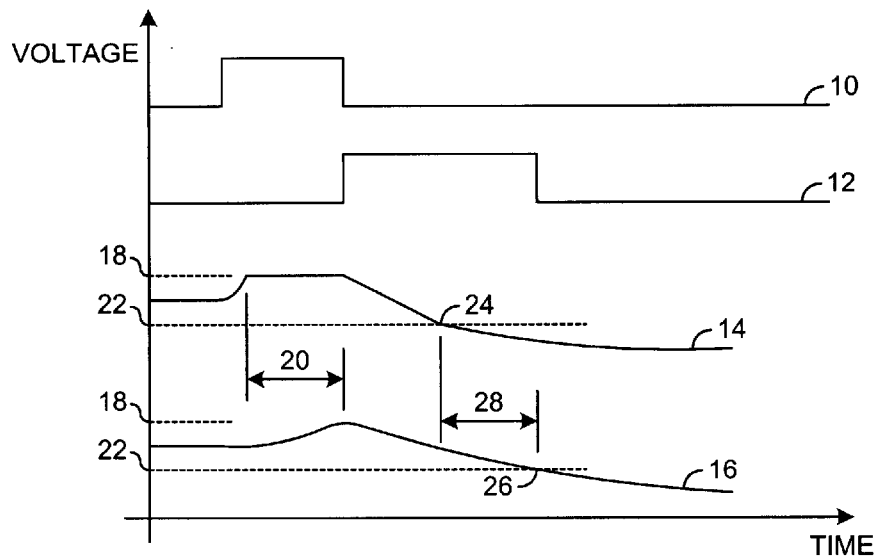
FIG. 1
(CONVENTIONAL)

US 6,501,695 B1

TECHNIQUE FOR THE REDUCTION OF MEMORY ACCESS TIME VARIATION

FIELD OF THE INVENTION

The present invention relates to a method and/or architecture for memory devices generally and, more particularly, to a method and/or architecture for equalized memory access times.

BACKGROUND OF THE INVENTION

In conventional memories with large row counts, a distributed RC effect in the bit lines creates variable read access times that depend upon the location of the bit cell being read relative to the sense amplifiers. Reading data stored in bit cells far from the sense amplifiers takes more time than reading data stored in bit cells close to the sense amplifiers. For non-self-timed type memories, the minimum read time is thus limited by the slowest, furthest row of bit cells from the sense amplifiers.

Referring to FIG. 1, a timing diagram of a read access in a conventional memory is shown. A waveform 10 represents a voltage of a precharge signal. A waveform 12 represents a voltage of a wordline signal. A waveform 14 represents a voltage of a bit line while reading data from a row nearest the sense amplifiers. A waveform 16 represents a voltage of the bit line while reading data from a row furthest from the sense amplifiers.

The read access begins with a precharge cycle that includes pulsing the precharge signal 10 for a fixed duration. The precharge cycle causes all bit lines to be charged to a predetermined initial voltage 18. The distributed RC effect of the bit lines results in portions of the bit lines close to the precharge circuitry to reach the predetermined initial voltage 18 before portions of the bit lines far from the precharge circuitry. An example of a precharging delay along the bit lines between the furthest and nearest portions is shown as a delay 20.

After the precharge cycle has completed, a sensing cycle is performed. The sensing cycle involves asserting the wordline signal 12 for a selected row within the conventional memory until a known value stored in a dummy bit cell within the selected row triggers a dummy sense amplifier, as represented by a line 22. A voltage differential induced in the bit lines by a bit cell in the nearest row will be detected at a time 24. A voltage differential induced in the bit lines by a bit cell in the furthest row will be detected at a later time 26. The difference in the time 24 to the time 26 is a delay 28 that represents a spread in the memory access times.

SUMMARY OF THE INVENTION

The present invention concerns a memory circuit generally comprising a sense amplifier, an array of bit cells, a plurality of bit lines, and a circuit. The array of bit cells may include a far bit cell disposed in the array opposite the sense amplifier. The bit lines may couple the bit cells to the sense amplifier. The circuit may be configured to assert a far wordline signal controlling the far bit cell during a precharge cycle for the bit lines.

The objects, features and advantages of the present invention include providing a method and/or architecture for equalized memory access times that may (i) provide closer access time variations among the bit cells regardless of where in the memory the data is being accessed and/or (ii) be easily integrated into a design without any detrimental impact.

BRIEF DESCRIPTION OF THE DRAWINGS

These and other objects, features and advantages of the present invention will be apparent from the following detailed description and the appended claims and drawings in which:

FIG. 1 is a timing diagram of a read access in a conventional memory;

DETAILED DESCRIPTION OF THE PREFERRED EMBODIMENTS

Figure 2:
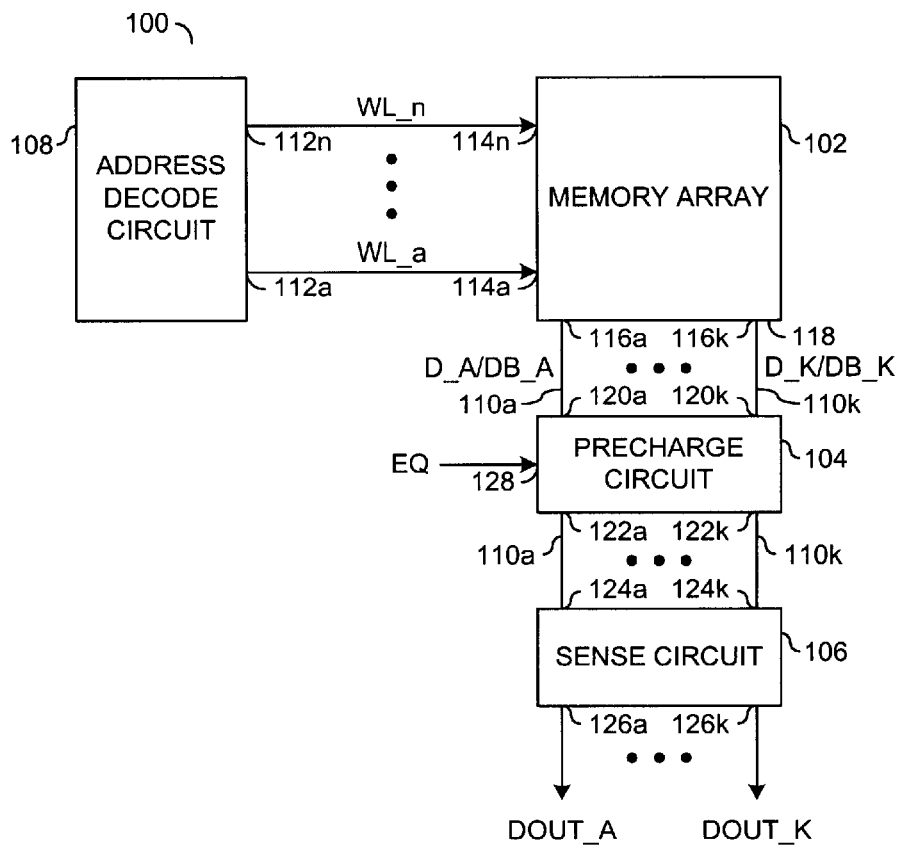
FIG. 2 is a block diagram of an example memory circuit implemented in accordance with the present intention.

Referring to FIG. 2, a block diagram of a memory circuit 100 is shown in accordance with a preferred embodiment of the present invention. The memory circuit 100 generally comprises a memory array 102, a precharge circuit 104, a sense circuit 106, an address decoder circuit 108, and multiple sense lines 110A–K. The sense lines 110A–K may couple the memory array 102 to the precharge circuit 104 and the sense amplifier circuit 106.

Multiple outputs 112A–N may be provided in the address decoder circuit 108 to present multiple signals (e.g., WL_A to WL_N) to multiple inputs 114A–N of the memory array 102. Multiple interfaces 116A–K may be provided in a bottom side 118 of the memory array 102. Each interface 116A–K may be coupled to an interface 120A–K of the precharge circuit 104 by the sense lines 110A–K respectively. The sense lines 110A–K may run through the precharge circuit 104 to another set of interfaces 122A–K. Each interface 122A–K may be coupled to an interface 124A–K of the sense circuit 106 by the sense lines 110A–K respectively. Each of the sense lines 110A–K generally comprises two bit lines for carrying two signals (e.g., D_x and DB_x, where $A \leq x \leq K$). Multiple outputs 126A–K may be provided in the sense circuit 106 to present multiple signals (e.g., DOUT_A to DOUT_K) respectively. An input 128 may be provided in the precharge circuit 104 to receive a signal (e.g., EQ).

The signals WL_y (where $A \leq y \leq N$) may be implemented as wordline signals. Each signal WL_y may have an asserted state (e.g., a logical HIGH state) and a de-asserted state (e.g., a logical LOW state). The signals D_x (where $A \leq x \leq K$) may be implemented as bit signals. The signals DB_x (where $A \leq x \leq K$) may be implemented as logical inverses of the signals D_x. The signals DOUT_x (where $A \leq x \leq K$) may be implemented as data signals. The signal EQ may be implemented as a precharge signal. The signal EQ may be shaped as a precharge pulse of a predetermined duration. The precharge signal EQ may be asserted (e.g., the logical HIGH state) during the predetermined duration and de-asserted (e.g., the logical LOW state) before and after the predetermined duration.

Figure 3:
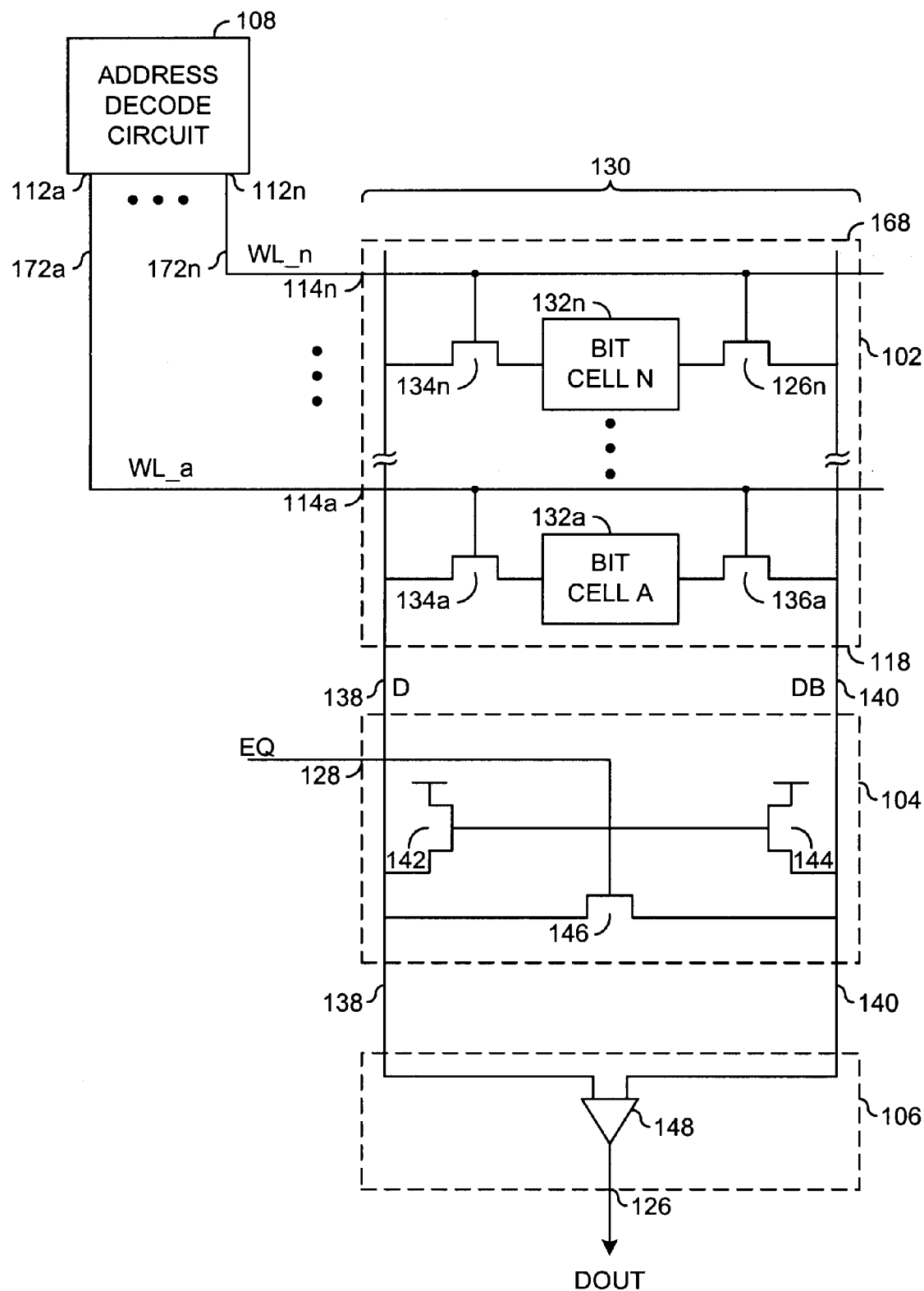
FIG. 3 is a detailed block diagram of an example implementation of the memory circuit.

Referring to FIG. 3, a detailed block diagram of a column 130 of the memory array 102, the precharge circuit 104, and the sense circuit 106 is shown. The column 130 of the memory array 102 generally comprises multiple bit cells 132A–N, multiple transistors 134A–N, and multiple transistors 136A–N. Each of the bit cells 132A–N may be coupled to a bit line 138 of the sense line 110 (FIG. 2) for the column 130 through the transistors 134A–N. Each of the bit cells 132A–N may be coupled to another bit line 140 of the sense line 110 (FIG. 2) for the column 130 through the transistors 136A–N. Each pair of transistors 134 and 136 may be controlled by a respective signal WL.

The column 130 of the precharge circuit 104 generally comprises a transistor 142, a transistor 144, and a transistor 146. The transistors 142 and 144 may be controlled by the signal EQ to precharge the bit lines 138 and 140. The transistor 146 may also be controlled by the signal EQ to help equalize a charge distribution between the bit line 138 and the bit line 140.

The column 130 of the sense circuit 106 generally comprises a sense amplifier 148. The sense amplifier 148 may be coupled to the bit lines 138 and 140 to receive the signals D and DB as a differential data signal. The sense amplifier 148 may generate and present the signal DOUT in response to the signals D and DB.

A read access of data in a selected bit cell 132 may be initiated by asserting the signal EQ. While the signal EQ is asserted, the transistors 142 and 144 may charge the bit lines 138 and 140 respectively. The transistor 146 may aid in equalizing a distribution of charge between the bit lines 138 and 140.

A selected wordline signal WL for the selected bit cell 132 may be asserted during the read access. While the selected wordline signal WL is asserted, the selected bit cell 132 may discharge one of the bit lines 138 or 140 and maintain the charge on the other bit line 138 or 140. A state of the data stored in the selected bit cell 132 may determine if the bit line 138 or the bit line 140 is to be discharged.

The sense amplifier 148 may generate and present the signal DOUT in a first logical state while a voltage difference between the signal D and the signal DB has at least a predetermined minimum amplitude and a positive polarity. The sense amplifier 148 may generate and present the signal DOUT in a second logical state, opposite the first logical state, while the voltage difference between the signal D and the signal DB has at least the predetermined minimum amplitude and a negative polarity. The data held in the selected bit cell 132 may thus be determined by the logical state of the signal DOUT.

Figure 4:
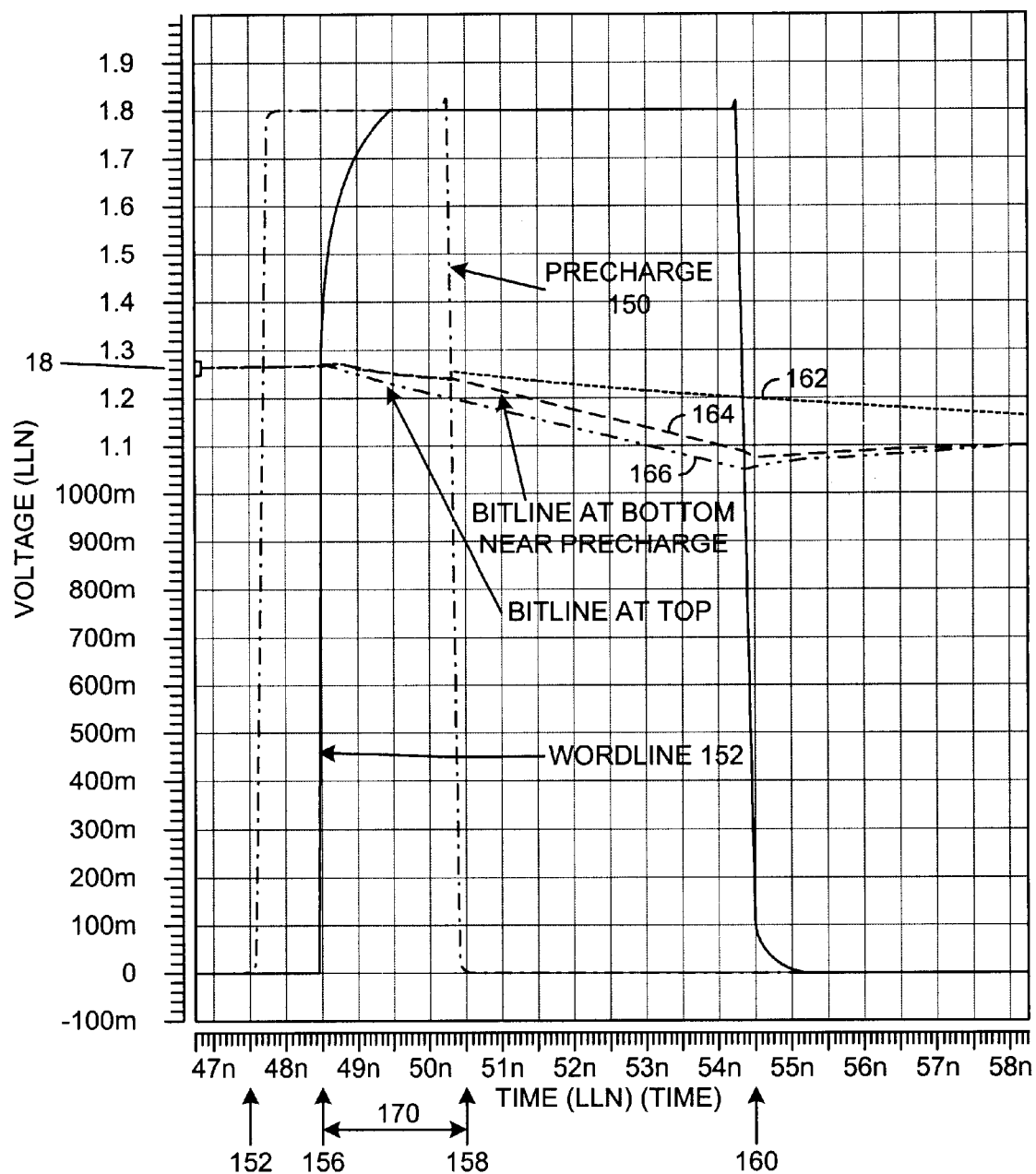
FIG. 4 is a timing diagram of a read access.

Referring to FIG. 4, a timing diagram of an example read access is shown. The read access may assume that the data being read has a first data state. A core of the read access generally comprises a precharge cycle and a sensing cycle. The precharge cycle may be defined by a voltage pulse of the precharge signal EQ, as represented by a waveform 150. The sensing cycle may be defined by a waveform 152 of the wordline signal WL. The precharge waveform 150 may overlap the wordline waveform 152. In particular, the signal EQ may be asserted at a time 154 to start the precharge cycle. The wordline signal WL may be asserted at a later time 156 during the precharge cycle. The signal EQ may then be de-asserted at a time 158 during the sensing cycle while the signal WL is still asserted. The signal WL may be de-asserted at a time 160.

A waveform 162 may represent a voltage of the signal D as measured at the bottom 118 of the memory array 102. The signal D at the bottom 118 is generally charged to the predetermined initial voltage 18 during the precharge cycle. The signal D in the example may gradually droop or discharge after the signal EQ has been de-asserted. A waveform 164 may represent a voltage of the signal DB as measured at the bottom 118 of the memory array 102. The signal DB at the bottom 118 may also be charged to the predetermined initial voltage 18 during the precharge cycle.

At the time 156 when the signal WL is asserted, a pull of the transistor 144 may maintain the signal DB at or near the predetermined initial voltage 18 even through the selected bit cell 132 may be trying to discharge the signal DB. Once the signal EQ has been de-asserted, the signal DB may be discharged by the selected bit cell 132. The discharging of the signal DB may end at the time 160 when a fixed data value in a dummy bit cell (not shown) in the selected row is sensed.

A waveform 166 may represent a voltage of the signal DB as measured at a top 168 (FIG. 3) of the memory array 102. The signal DB at the top 168 may be charged to the predetermined initial voltage 18 during the precharge cycle. When a selected signal WL controlling a row at or near the top 168 of the memory array 102 is asserted, the selected bit cell 132 may start to discharge the signal DB in an adjacent region of the bit line 140 The discharging of the signal DB may end when a fixed value in a dummy bit cell (not shown) in the selected row is sensed. The rolls of the signal D and the signal DB may be reversed if the selected bit cell 132 contains data having a second data state opposite the first data state.

A time duration 170 between the time 156 and the time 158 may represent an overlap between the precharge cycle and the sensing cycle where both the signal EQ and the signal WL are asserted. During the time duration 170, the selected bit cell 132 may be contending with the precharge circuit 104 to control the signal D and the signal DB. If the selected bit cell 132 is at or near the top 168 of the memory array 102, a small voltage differential may be set up between the signal D and the signal DB in an upper region of the bit lines 138 and 140 prior to the release of the lower region of the bit lines 138 and 140 when the precharge cycle is over. The small voltage differential may be due to the RC effect of the bit lines 138 and 140 and a distance from the precharge circuit 104. As a result, some of the charge that must be removed from the bit line 140 in order for the sense amplifier 148 to sense the data may already be gone prior to completing the precharge cycle. The initial differential voltage at the top of the bit lines 138 and 140 will generally accelerate reading from the upper rows of the memory array 102.

The timing of the signal EQ and the signal WL may be varied to achieve several different effects. For example, the timing may be designed to provide more consistent read access times across the different rows of the memory array 102, given an adequate precharge pulse width. In another example, the timing may be designed to shorten the read access times. The actual implementation of the timing between the signal EQ and the signal WL may vary greatly to meet the design criteria of a particular application.

A reduction in the memory access time variations may be achieved if the time duration 170 is at least as long as the delay 28 (FIG. 1) between sensing the nearest bit cell 132A and sensing the furthest bit cell 132N due to the RC effect in the bit lines 138 and 140. For example, a first set or portion of the signals WL for the bit cells 132 located near the sense amplifier 148 may be conventionally asserted upon completion of the precharge cycle (e.g., at the time 158). A second set or portion of the signals WL for the bit cells 132 located furthest from the sense amplifier 148 may be asserted early during a first half of the precharge cycle. As a result, discharging at the top of the bit lines 138 and 140 may start early at the time 156 instead of the time 158. The early start to discharging may be designed to offset the delay 28 and thus minimize variations in the read accesses.

A reduction in read access times may be accomplished by asserting all signals WL during the precharge cycle. The precharge circuit 104 is generally located near the bottom 118 of the memory array 102. As a result, good bit line equalization is more difficult to achieve at the top than at the bottom of the bit lines 138 and 140. The upper row bit cells 132 may assist with the precharging of the upper portions of the bit lines 138 and 140. By enabling the selected signal WL early, the selected bit cell 132 may begin establishing a differential charge on the bit lines 138 and 140 sooner than in a conventional design.

If a current read cycle is for the same data state that was accessed in a prior read cycle, then the minimal differential charge required to sense the data state will be established sooner. If the current read cycle is for an opposite data state as the prior read cycle, then the selected bit cell 132 may effectively help to precharge and equalize the bit lines 138 and 140 prior to setting up the appropriate differential charge. A design of the precharge timing may be modified to take advantage of the early charge differential created by the selected bit cell 132 and thus the precharge signal EQ could be de-asserted sooner. Conventionally, the precharge pulse width timing would be set to adequately equalize all portions of the bit lines 138 and 140. However, with help from the selected bit cell 132 at the far end of the bit lines 138 and 140, which is more difficult to precharge, the pulse width of the signal EQ could be reduced.

Referring again to FIG. 3, variations in the read access timing may be reduced by a proper placement of the read decode circuit 108 relative to the inputs 114A–N of the memory array 102. In particular, locating the read decode circuit 108 near the top 168 of the memory array 102 may alter the timing of the nearby signals WL.

Each output 112A–N of the address decode circuit 108 may be coupled to the input 114A–N by a respective conductor 172A–N. A long conductor 172A may introduce a long delay in the signal WL__A as compared to the signal WL__N in a short conductor 172N. Likewise, the other conductors 172B–M may establish a spectrum of delays in the signals WL__B to WL__M. The different conductor lengths may inherently speed up assertions of wordline signals WL for the rows near the top 168 of the memory array 102 as compared to the rows near the bottom 118 of the memory array 102. However, the sense circuit 106 may read the bit cells 132 near the bottom 118 quicker than the bit cells 132 near the top 168 due to the RC effect of the bit lines 138 and 140. The delays introduced by the conductors 172A–K and the bit lines 138 and 140 may offset and cancel each other. An approximately constant read access timing may occur as a result.

Figure 5:
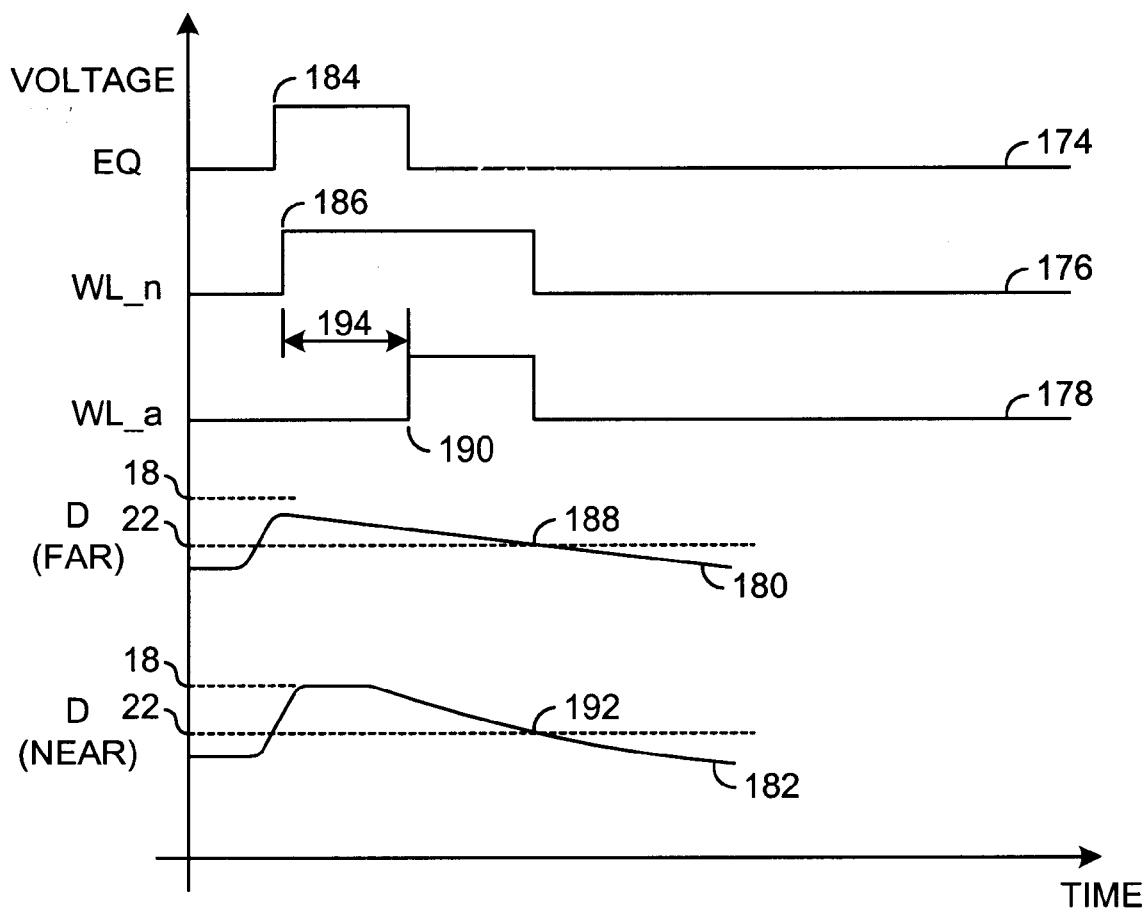
FIG. 5 is a timing diagram of a read access delaying assertion of some wordline signals.

Referring to FIG. 5, a timing diagram of a read access delaying assertions of the wordline signals WL is shown. The signal EQ may be represented by a waveform 174. The signal WL__N may be represented by a waveform 176. The signal WL__A may be represented by a waveform 178. The signal D caused by reading data from the far bit cell 132N may be represented by a waveform 180. The signal D caused by reading data from the near bit cell 132A may be represented by a waveform 182.

The pulse cycle may start at a time 184. If selected, the signal WL__N for the far row may be asserted shortly thereafter at a time 186 and the associated data sensed at a time 188. If selected, the signal WL__A for the near row may be asserted at a time 190 and the associated data sensed at a time 192. The conductor 172A may introduce a delay 194 in asserting the signal WL__A as compared to asserting the signal WL__N. If the delay 194 is no greater than the delay 28 (FIG. 1), then a period from the start of the precharge cycle to sensing the data from the near row (e.g., the time 184 to 192) may be the same time duration or shorter than another period from the start of the precharge cycle to sensing the data from the far row (e.g., the time 184 to 188). Matching the delays of the conductors 172A–N to the delays introduced to the various rows by the bit lines 138 and 140 may minimize or eliminate (e.g., the time 188 equals the time 192) any variations in read access timing among the rows. Other timing variations among the signals may be implemented to meet the design criteria of a particular application.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. A memory circuit comprising:
   a sense amplifier;
   an array of bit cells including a far bit cell disposed in said array opposite said sense amplifier;
   a plurality of bit lines coupling said bit cells to said sense amplifier; and
   a circuit configured to assert a far wordline signal controlling said far bit cell during a precharge cycle for said bit lines.

2. The memory circuit according to claim 1, wherein said circuit is further configure to assert a second wordline signal controlling a second bit cell selected from a portion of said bit cells during a second precharge cycle.

3. The memory circuit according to claim 1, wherein said circuit is further configured to assert a second wordline signal controlling a second bit cell of said bit cells during a second precharge cycle.

4. The memory circuit according to claim 1, wherein a period between asserting said far wordline signal and completing said precharge cycle is at least as long as a time difference in sensing said far bit cell relative to sensing a near bit cell of said bit cells proximate said sense amplifier as caused by said bit lines.

5. The memory circuit according to claim 1, wherein said circuit is further configured to assert said far wordline signal within a first half of said precharge cycle.

6. The memory circuit according to claim 1, further comprising a conductor configured to delay asserting a near wordline signal controlling a near bit cell of said bit cells proximate said sense amplifier during a second precharge cycle.

7. The memory circuit according to claim 6, further comprising a precharge circuit (i) disposed proximate said sense amplifier and (ii) configured to control said precharge cycles.

8. The memory circuit according to claim 7, wherein said delay in asserting said near wordline signal is no longer than a time difference in sensing said far bit cell relative to sensing said near bit cell as caused by said bit lines.

9. The memory circuit according to claim 7 wherein (A) said circuit is further configured to assert said far wordline signal within a first half of said precharge cycle and (B) a first period between starting said precharge cycle and sensing said far bit cell is approximately equal to a second period between starting said second precharge cycle and sensing said near bit cell.

10. A method of operating a memory circuit comprising the steps of:

(A) starting a precharge cycle for a plurality of bit lines coupling an array of bit cells to a sense amplifier;

(B) asserting a far wordline signal controlling a far bit cell of said bit cells disposed in said array opposite said sense amplifier in response to starting said precharge cycle; and (C) completing said precharge cycle while said far wordline signal is asserted.

11. The method according to claim 10, further comprising the steps of:

starting a second precharge cycle for said bit lines;

asserting a second wordline signal controlling a second bit cell selected from a portion of said bit cells in response to starting said second precharge cycle; and completing said second precharge cycle while said respective wordline signal is asserted.

12. The method according to claim 10, further comprising the steps of:

starting a second precharge cycle for said bit lines;

asserting a second wordline signal controlling a second bit cell of said bit cells in response to starting said second precharge cycle; and completing said second precharge cycle while said respective wordline signal is asserted.

13. The method according to claim 10, wherein a period between asserting said far wordline signal and completing said precharge cycle is at least as long as a time difference in sensing said far bit cell relative to sensing a near bit cell of said bit cells proximate said sense amplifier as caused by said bit lines.

14. The method according to claim 10, wherein the step of asserting said far wordline signal is performed within a first half of said precharge cycle.

15. The method according to claim 10, further comprising the step of delaying an assertion of a near wordline signal controlling a near bit cell of said bit cells proximate said sense amplifier in response to starting a second precharge cycle.

16. The method according to claim 15, further comprising the step of controlling said precharge cycles from a location proximate said sense amplifier.

17. The method according to claim 16, wherein delaying said assertion of said near wordline signal is no longer than a time difference in sensing said far bit cell relative to sensing said near bit cell as caused by said bit lines.

18. A memory circuit comprising:

means for starting a precharge cycle for a plurality of bit lines coupling an array of bit cells to a sense amplifier;

means for asserting a far wordline signal controlling a far bit cell of said bit cells disposed in said array opposite said sense amplifier in response to starting said precharge cycle; and means for completing said precharge cycle while said far wordline signal is asserted.

* * * * *